(12) United States Patent
Miyashita et al.

(10) Patent No.: US 7,235,001 B2
(45) Date of Patent: Jun. 26, 2007

(54) POLISHING APPARATUS

(75) Inventors: Tadakazu Miyashita, Nagano (JP); Yoshikazu Nakamura, Nagano (JP); Yoshiyuki Nomura, Nagano (JP)

(73) Assignee: Fujikoshi Machinery Corp., Nagano (JP)

( * ) Notice: Subject to any disclaimer, the term of this patent is extended or adjusted under 35 U.S.C. 154(b) by 0 days.

(21) Appl. No.: 11/392,697

(22) Filed: Mar. 30, 2006

(65) Prior Publication Data
US 2006/0223421 A1    Oct. 5, 2006

(30) Foreign Application Priority Data
Apr. 1, 2005    (JP) .............................. 2005-106895

(51) Int. Cl.
*B24B 49/00*    (2006.01)
(52) U.S. Cl. .......................... 451/11; 451/36; 451/285; 438/692
(58) Field of Classification Search ................ 451/5, 451/6, 8, 9, 11, 36, 41, 60, 59, 63, 285–290; 216/88, 89; 438/692, 693
See application file for complete search history.

(56) References Cited

U.S. PATENT DOCUMENTS

| | | | |
|---|---|---|---|
| 6,431,949 B1 * | 8/2002 | Ishikawa et al. ............... 451/5 |
| 6,439,971 B2 * | 8/2002 | Okumura et al. ............. 451/41 |
| 6,609,950 B2 * | 8/2003 | Kimura et al. .................. 451/5 |
| 6,846,224 B2 * | 1/2005 | Ki .................................. 451/9 |
| 2002/0124373 A1 | 9/2002 | Katsuoka et al. | |
| 2004/0127142 A1 | 7/2004 | Olgado | |

FOREIGN PATENT DOCUMENTS

| EP | 0347718 A2 | 12/1989 |
| EP | 0911114 A2 | 4/1999 |
| JP | 11-347992 A | 12/1999 |

\* cited by examiner

*Primary Examiner*—Lee D. Wilson
*Assistant Examiner*—Anthony Ojini
(74) *Attorney, Agent, or Firm*—Birch, Stewart, Kolasch & Birch, LLP

(57) ABSTRACT

The polishing apparatus is capable of transferring a work piece to a top ring without moving the work piece from the center and capable of precisely polishing the work piece. The polishing apparatus has a transfer unit for transferring the work piece to the top ring. The transfer unit comprises: a guide member having a receiving section, which centers the work piece; a mounting table vertically moving with respect to the guide member, the mounting table having a mounting section, which receives the centered work piece; and a supporting mechanism supporting the mounting table and allowing the mounting table to move downward. The mounting table is relatively moved close to the top ring and presses the work piece onto the top ring so as to transfer the work piece to the top ring.

16 Claims, 8 Drawing Sheets

POLISHING APPARATUS

BACKGROUND OF THE INVENTION

The present invention relates to a polishing apparatus for polishing work pieces, e.g., wafer.

Many types of polishing apparatuses are known.

An ordinary polishing apparatus has a polishing plate, whose upper face is covered with polishing cloth, and a top ring, which has a lower face for holding a work piece and presses a lower face of the work piece onto the polishing cloth. The polishing plate and the top ring are relatively moved so as to polish the lower face of the work piece.

Generally, the work piece is conveyed to a transfer unit by a robot hand, the transfer unit centers the work piece, and the top ring is moved to the transfer unit to receive the work piece.

A conventional polishing apparatus having a transfer unit is disclosed in Japanese Patent Gazette No. 11-347922.

The transfer unit comprises: a pusher stage having a supporting face, on which a work piece, e.g., a semiconductor wafer, will be mounted; an elevating unit for vertically moving the pusher stage; and a guide member, which is located in a periphery of the pusher stage and which has a guide face, which is a female-tapered face.

The semiconductor wafer is conveyed to the pusher stage by the robot hand and mounted onto the supporting face of the pusher stage. Then, the pusher stage is moved downward together with the wafer. The wafer enters the guide member, and an outer circumferential face of the wafer contacts the guide face of the guide member, so that the wafer can be centered. The pusher stage is moved upward, received the centered wafer and presses the centered wafer onto a lower face of the top ring, so that the wafer can be held by the top ring.

After polishing the wafer, the polished wafer is conveyed from the top ring to the transfer unit by the backward process, then the wafer is conveyed from the transfer unit to an external place by the robot hand.

However, in the conventional transfer unit, the work piece is moved from the pusher stage to the female-tapered guide face so as to perform centering of the work piece. When the work piece is transferred to the top ring, the pusher stage is moved upward so as to receive the work piece and press the work piece onto the top ring. Therefore, the centered work piece is vibrated while the pusher stage is moved toward the top ring, thereby the work piece will be easily moved from the center. If the work piece is moved or shifted from the center, the work piece will be damaged or broken.

SUMMARY OF THE INVENTION

The present invention was conceived to solve the above described problems.

An object of the present invention is to provide a polishing apparatus, which is capable of transferring a work piece to a top ring without moving the work piece from the center and capable of precisely polishing the work piece.

To achieve the object, the present invention has following structures.

Namely, the polishing apparatus of the present invention comprises:

a polishing plate having an upper face covered with polishing cloth;

a top ring having a lower face for holding a work piece and pressing a lower face of the work piece onto the polishing cloth, the top ring being relatively moved with respect to the polishing plate so as to polish the lower face of the work piece; and a transfer unit being located at a work piece transfer position, at which the work piece is transferred to the top ring, wherein the transfer unit comprises:

a guide member having a receiving section, which guides an outer edge of the transferred work piece so as to perform centering of the work piece;

a mounting table being relatively vertically moving with respect to the guide member, the mounting table having a mounting section, which receives the centered work piece from the guide member with an upper face projecting upward; and a supporting mechanism supporting the mounting table and allowing the mounting table to move downward, and wherein the mounting table is relatively moved close to the top ring and presses the work piece onto the lower face of the top ring so as to transfer the work piece to the top ring.

In the polishing apparatus, the top ring may be moved downward and moves the work piece, which has been centered on the mounting table, together with the mounting table so as to transfer the work piece to the top ring.

In the polishing apparatus, the guide member may be a plurality of pins, each of which has a tapered upper end acting as a guide section for centering the work piece.

In the polishing apparatus, the mounting section of the mounting table may be circularly projected upward from an outer circumferential edge of the mounting table.

In the polishing apparatus, a mounting face of the mounting section may be a female tapered face, whose internal diameter is gradually made smaller toward a lower end.

In the polishing apparatus, an elastic member may be provided to a base, and the elastic member may elastically support the mounting table and allow the mounting table to move downward.

In the polishing apparatus, the elastic member may be a coil spring, which is extended downward from the mounting table, attached on a shaft piercing through the base and elastically clamped between the mounting table and the base.

In the polishing apparatus, a part of the shaft, which downwardly projects from the base, may be a first screw section, a nut may be screwed with the first screw section, a part of the shaft, which pierces through the base, may be covered with a screw cylinder whose outer circumferential face includes a second screw section screwed with the base, and a height of the mounting table with respect to the base and an elastic force of the coil spring can be adjusted by adjusting a screwing position of the screw cylinder with respect to the base and a screwing position of the nut.

In the polishing apparatus, the mounting table may be vertically moved along a guide rod with maintaining a horizontal situation with respect to the base.

In the polishing apparatus, an elevating member, which is vertically moved by a driving unit, may be provided to the base, and the guide member may be provided in the elevating member.

In the polishing apparatus, the guide rod may guide not only the mounting table but also the elevating member.

In the polishing apparatus, the transfer unit may further comprise:

a supporting member supporting the mounting table, the supporting member having an elastic member, which allows the mounting table to move downward; and a plurality of positioning pieces being provided to the supporting member so as to contact an outer edge of the work piece, which has been centered on the mounting table, and position the work piece.

By using the polishing apparatus of the present invention, the work piece can be transferred to the top ring without shifting from the center, so that the work piece can be polished with high polishing accuracy.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

Figure 1:
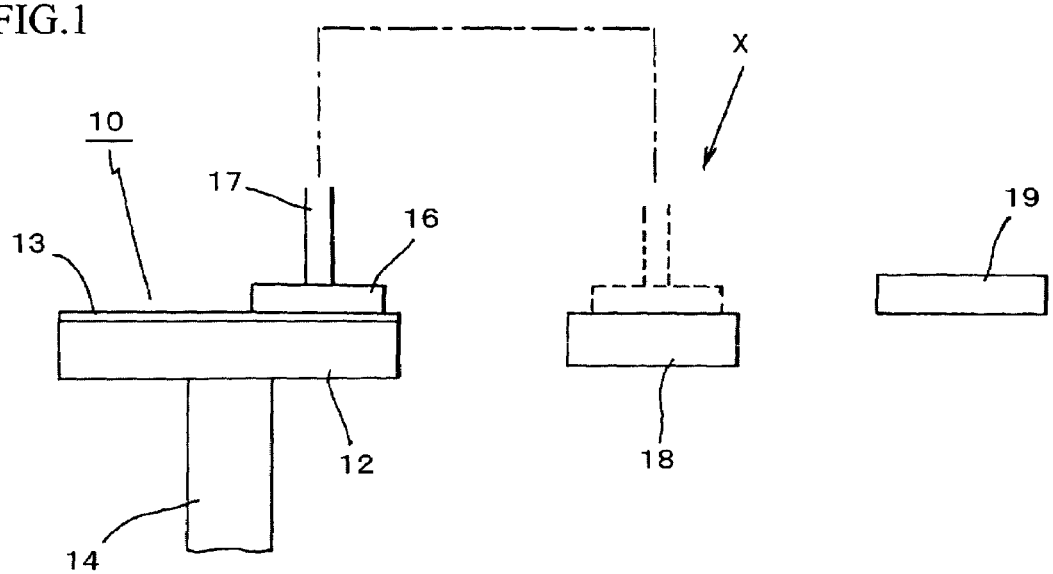
FIG. 1 is an explanation view of a first embodiment of the polishing machine of the present invention.

FIG. 1 is an explanation view of a polishing apparatus 10 of a first embodiment of the present invention.

FIG. 1, polishing cloth 13 is adhered on an upper face of a polishing plate 12 by, for example, adhesive. The polishing plate 12 is rotated about a spindle 14 in a horizontal plane. The spindle 14 is rotated by a known means (not shown).

A top ring 16 is attached to a lower end of a rotary shaft 17. The rotary shaft 17 is rotated about its own axis and vertically moved by a known mechanism (not shown). The top ring 16 is moved between a first position, which is located above the polishing plate 12, and a second position X, which is located outside of the polishing plate 12. The second position X is a work piece transfer position.

A transfer unit 18 for transferring a work piece is located at the work piece transfer position X. A conveyor unit 19 has a robot hand (not shown). The conveyor unit 19 conveys the work piece to be polished into the transfer unit 18 and takes out the polished work piece threrefrom.

The work piece is transferred from the transfer unit 18 to a lower face of the top ring 16, the top ring 16 presses the work piece onto the polishing cloth 13 of the polishing plate 12, and the polishing plate 12 and the top ring 16 are rotated, so that the work piece can be polished. After completing the polish, the work piece is transferred from the top ring 16 to the transfer unit 18, then the work piece is taken out from the transfer unit 18 by the robot hand.

Figure 2:
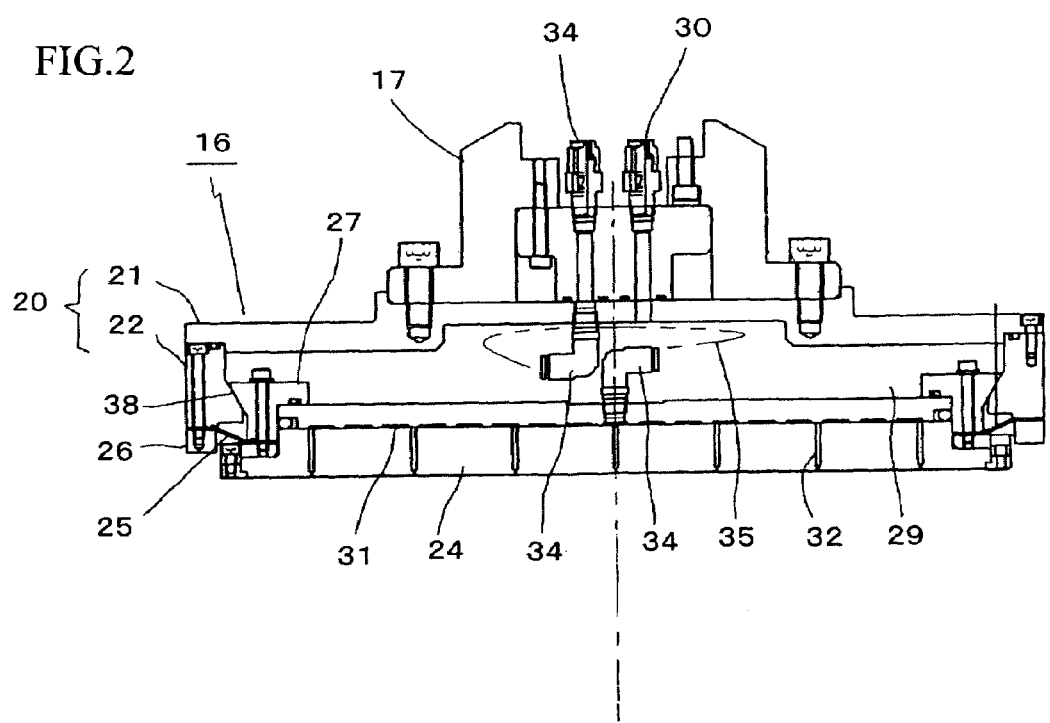
FIG. 2 is a sectional view of a top ring.

FIG. 2 is a sectional view of the top ring 16. The top ring 16 is a known top ring, so its structure will be briefly explained.

A head proper 20 includes a ceiling section 21, which is fixed to the shaft 17, and a cylindrical section 22, which is fixed to a lower outer circumferential edge of the ceiling section 21.

A holding plate 24 is located under the head proper 20 and capable of moving upward and downward with a ring-shaped diaphragm 25. An outer circumferential edge of the diaphragm 25 is fixed to a lower face of the cylindrical section 22 by a fixing member 26; an inner circumferential edge of the diaphragm 25 is fixed to an outer circumferential edge of the holding plate 24 by a fixing member 27.

A first chamber 29, which is tightly closed by the diaphragm 25, is formed between the head proper 20 and the holding plate 24. A pressurized fluid is introduced into the first chamber 29 from a fluid source (not shown) via a joint 30. With this structure, the work piece can be pressed onto the polishing cloth 13.

Coaxial second chambers 31 are formed in the holding plate 24. The second chambers 31 are mutually communicated by grooves (not shown) extended in radial directions. Many small holes 32, which are communicated to the second chambers 31, are evenly opened in a lower face of the holding plate 24.

Figure 3:
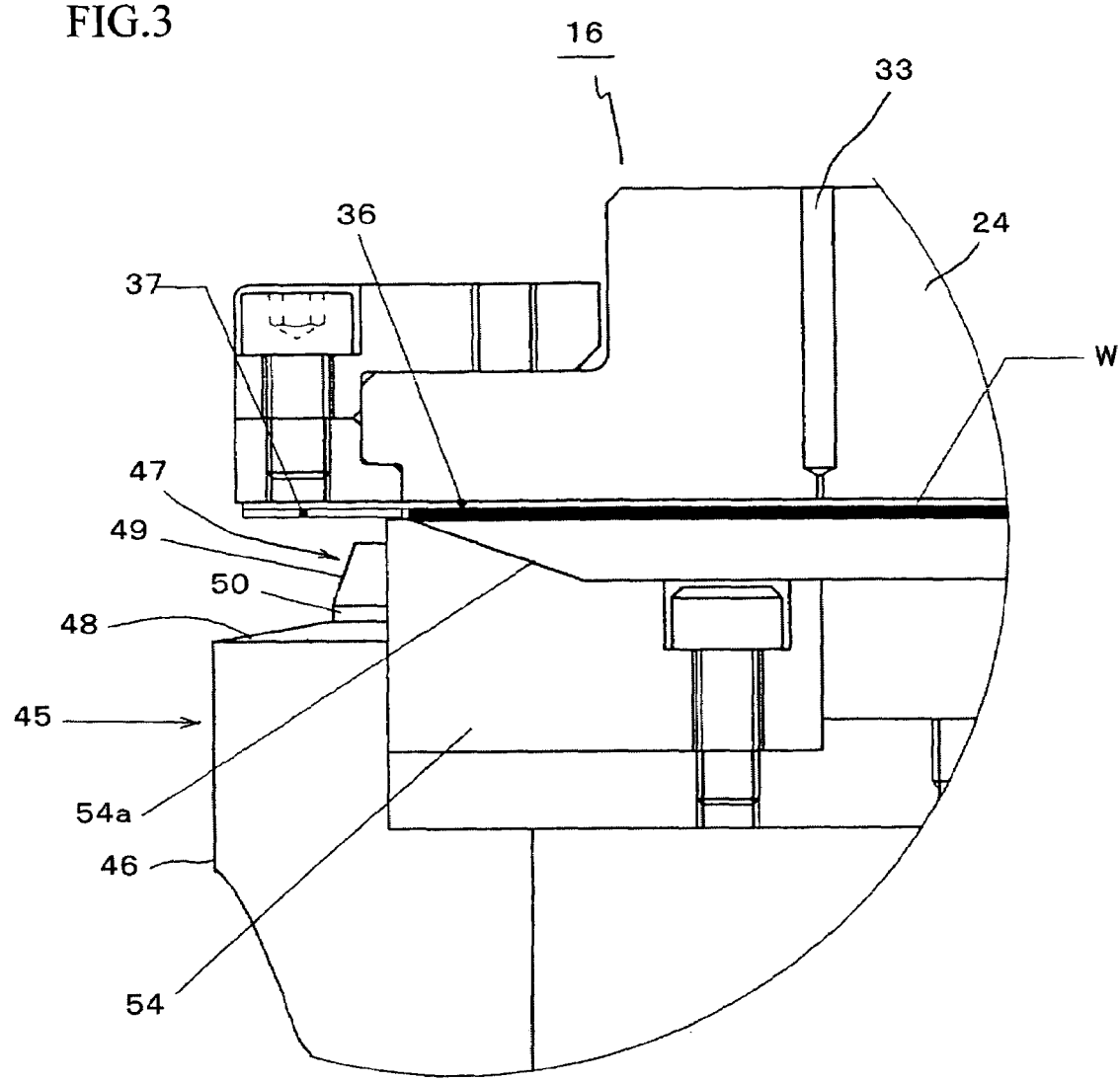
FIG. 3 is an explanation view showing the top ring, a work piece and a mounting section.

A pressurized fluid is introduced into the second chambers 31 from the fluid source (not shown) via a joint 34 and a pipe 35 and jetted downward from the small holes 32 of the holding plate 24. As shown in FIG. 3, a backing pad 36 having fine holes is provided on the lower face of the holding plate 24, and a ring-shaped template 37 is provided to a lower outer circumferential edge of the backing pad 36. The pressurized fluid, which has been jetted downward from the lower face of the holding plate 24, is further jetted downward from the fine holes of the backing pad 36. Therefore, the work piece W is further pressed onto the polishing cloth 13 by the jetted fluid.

To hold the work piece, the fluid in the second chambers 31 is sucked, so that the work piece W is drawn to and held on a lower face of the backing pad 36.

Note that, an inner face of the cylindrical section 22 and an outer face of the fixing member 27 are tapered faces 38, which are mutually fit, so that the holding plate 24 is correctly centered without falling out from the cylindrical section 22.

The characteristic point of the present invention is the transfer unit 18.

Figure 4:
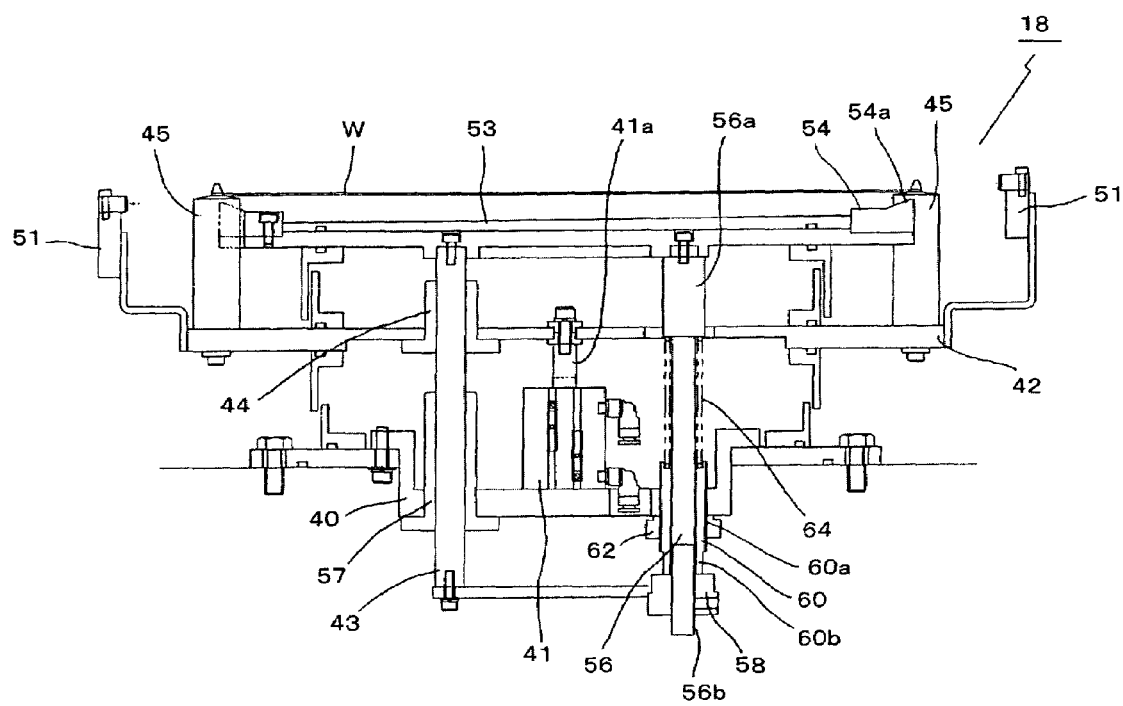
FIG. 4 is a sectional view of a transfer unit, in which the work piece is centered by pins.

FIG. 4 is a sectional view of the transfer unit 18 of the first embodiment.

An elevating table (an elevating member) 42, which is vertically moved by a cylinder unit (a driving unit) 41, is provided to a base 40. The elevating member 42 is connected with a piston rod 41a, and guide rods 43 are respectively guided by guide bushings 44. By driving the cylinder unit 41, the elevating member 42 is vertically moved with maintaining the horizontal situation.

The elevating member 42 is a circular plate. Six pins (guide members) 45, which are extended upward, are provided to an outer circumferential edge of the elevating member 42 and arranged in the circumferential direction at regular intervals (see FIG. 5).

As shown in FIG. 3, each of the pins 45 has a lower pin section 46, which is a thicker section, and an upper pin section 47, which is a tapered part. A border section between the lower pin section 46 and the upper pin section 47 has a tapered face 48, whose diameter is gradually made greater toward a lower end. And, the upper pin section 47 also has a tapered face 49, whose diameter is gradually made greater toward a lower end. Note that, a lower end of the upper pin section 47 is a columnar part 50 having a fixed diameter and connected with an upper end of the tapered border section 49.

Outer circumferential faces of the upper pin sections 47 of the six pins 47 act as receiving sections for guiding the work piece W. A known robot hand H (see FIG. 5) holds an outer circumferential edge of the work piece W and conveys the work piece W into a space between the six upper pin sections 47, then the robot hand H releases the work piece W. With this action, the outer circumferential edge of the work piece W is guided by the outer circumferential face of the upper pin sections 47, so that the work piece W falls into a space between the six columnar parts 50. Therefore, the work piece W is centered and mounted on upper parts of the tapered faces 48. Clearances between the outer circumferential faces of the columnar parts 50 and the outer circumferential face of the work piece W are about 0.5 μm.

In FIG. 4, sensors 51, each of which has a light emitting section and a light receiving section, detect if the work piece W passes through a space between the upper pin parts 47 of the pins 45 or not.

A mounting table 53 is a circular plate, and a ring-shaped mounting section 54, which is extended upward, is provided along the outer circumferential edge of the mounting table 53. By moving the pins 45 downward, the work piece W is transferred from the pins 45 to the mounting section 54. The mounting section 54 has a mounting face 54a is a female tapered face, whose internal diameter is gradually made smaller toward a lower end. As shown in FIG. 3, when the work piece W is transferred to the mounting face 54a, a height of an upper face of the work piece W is a height of a top end of the mounting face 54a. Namely, sizes of the work piece W and the mounting face 54a are designed so as to project the work piece W upward. As shown in FIG. 3, the projected height of the work piece W is designed so as to prevent the template 37 from interfering with an upper part of the mounting section 54 when the top ring 16 is moved downward to press the work piece W with the backing pad 36.

Figure 5:
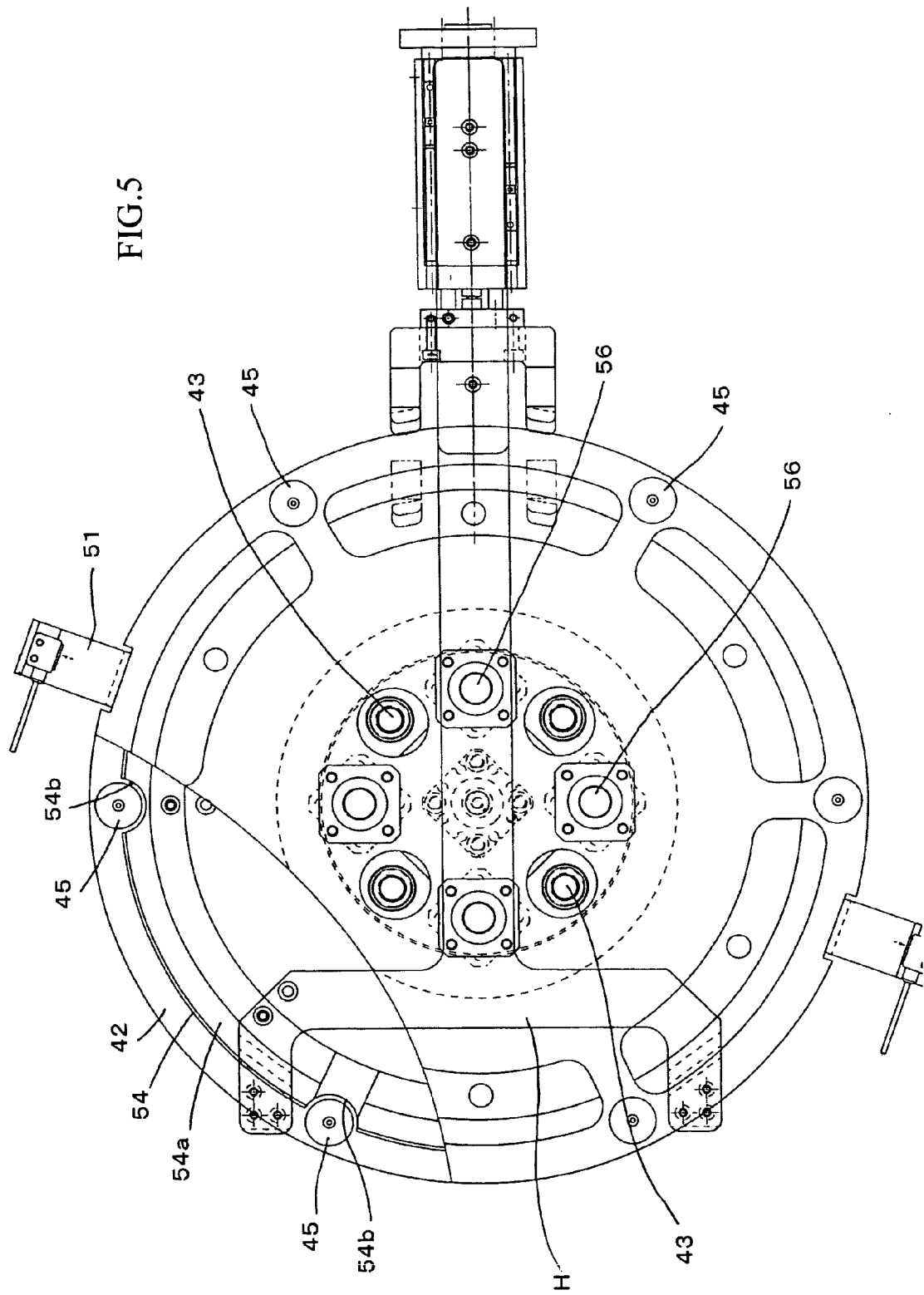
FIG. 5 is an explanation view showing an arrangement of guide rods, shafts and the pins.

As shown in FIG. 5, the mounting section 54 has notches 54b, which have semicircular shapes, and an inner half part of each pin 45 can be passed thorough each notch 54.

The mounting table 53 is elastically supported by coil springs (elastic members) and allowed to move downward with respect to the base 40. The supporting mechanism for supporting the mounting table 53 will be explained.

Four guide rods 43 and four shafts 56 are extended downward from a lower face of the mounting table 53, and they are alternately arranged on the same circle. Lower parts of the guide rods 43 and the shafts 56 pierce through the base 40, and they are further extended downward. Their arrangement is shown in FIG. 5 by solid lines.

The guide rods 43 pierce through the base 40 with guide bushings 57. Namely, the guide rods 43 guide not only the elevating member 42 but also the mounting table 53. The mounting table 53 can be moved upward and downward with maintaining the horizontal situation.

Upper parts of the shafts 56 are large diameter parts 56a, whose diameters are larger than those of lower parts.

Parts 56b of the shafts 56, which are projected downward from the base 40, are first screw sections, and nuts 58 are screwed with the first screw sections 56b. Parts of the shafts 56, which pierce through the base 40, are respectively covered with screw cylinders 60, whose outer circumferential faces include second screw sections 60a screwed with the base 40. A tool can be engaged with engage sections 60b of the screw cylinders 60 so as to turn the screw cylinders 60. By turning the screw cylinders 60, positions of the screw cylinders 60 with respect to the base 40 can be adjusted. The positions of the screw cylinders 60 can be fixed by nuts 62.

The coil springs 64 cover parts of the shafts 56, each of which is located between an upper end of the screw cylinder 60 and a lower face of the large diameter part 56a. Therefore, the mounting table 53 is supported by the four coil springs 64. When the mounting table 53 is pressed downward, the coil springs 64 are compressed downward (see FIG. 7).

With this structure, a height of the mounting table 53 with respect to the base 40 and elastic forces of the coil springs 64 can be adjusted by adjusting screwing positions of the screw cylinders 60 with respect to the base 40 and a screwing positions of the nuts 58.

The transfer unit 18 of the first embodiment has the above described structure. Successively, action of the transfer unit 18 will be explained.

In FIG. 4, the elevating table 42 has been moved upward, and the upper pin sections 47 of the pins 45 locate at positions fully above an upper face of the mounting section 54 of the mounting table 53.

In this state, the robot hand H holds the outer edge of the work piece W, which has been accommodated in, for example, a magazine (not shown) and conveys the work piece W into the space between the six upper pin sections 47. Then, the robot hand H releases the work piece W. The work piece W is guided by the outer circumferential faces of the upper pin sections 47 and falls onto the upper parts of the tapered faces 48, so that the work piece W can be correctly positioned (see FIG. 4).

Figure 6:
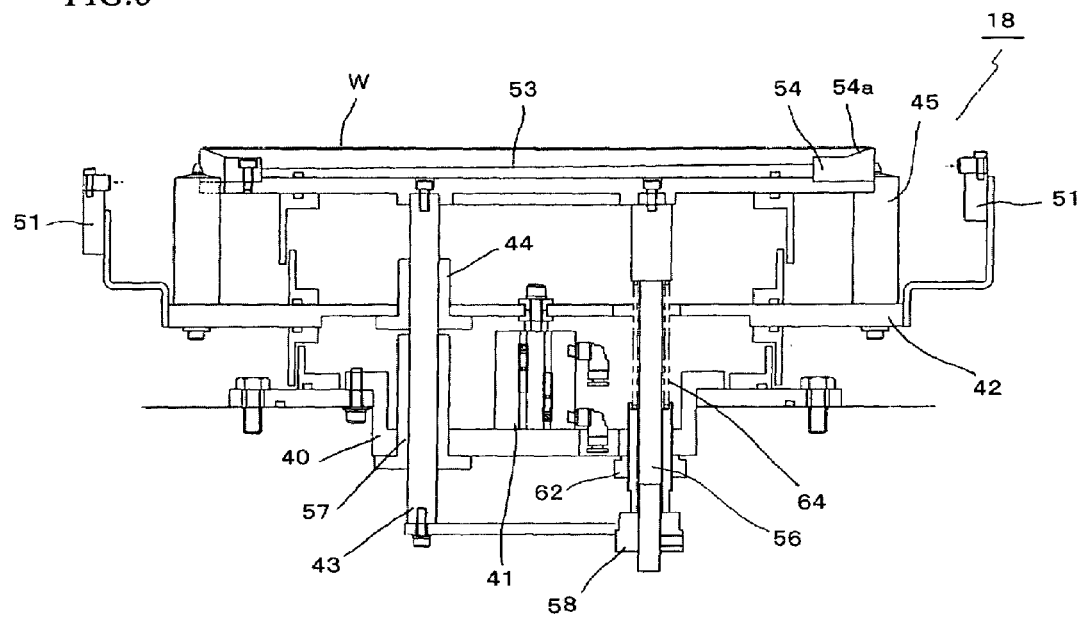
FIG. 6 is a sectional view of the transfer unit, in which the pins are moved downward.

Next, as shown in FIG. 6, the cylinder unit 41 moves the elevating table 42 downward together with the pins 45. With this action, the work piece W is transferred onto the mounting face 54a of the mounting section 54. As described above, the height of the upper face of the work piece W is higher than the height of the upper end of the mounting face 54a, so the work piece W is projected upward when the work piece W is transferred to the mounting face 54a (see FIG. 3).

Figure 7:
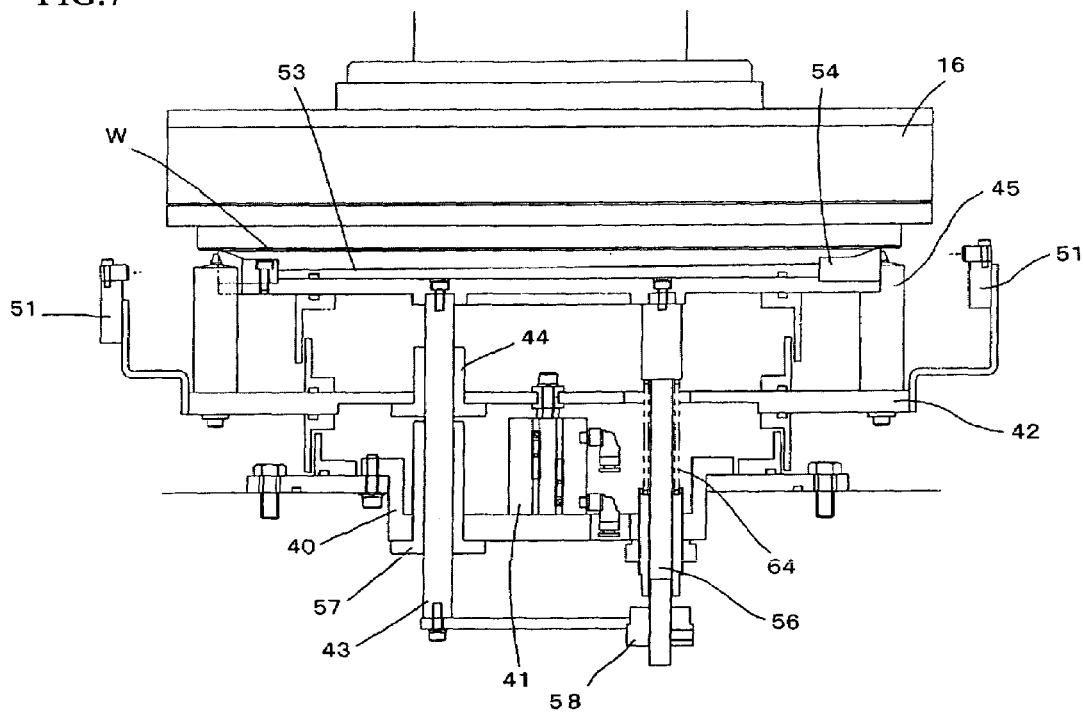
FIG. 7 is a sectional view of the transfer unit when the top ring is moved downward so as to hold the work piece.

Then, as shown in FIG. 7, the top ring 16 is moved downward, and the backing pad 36 contacts the upper face of the work piece W. In this state, the top ring 16 is further moved downward against the elastic forces of the coil springs 64. The coil springs 64 are compressed, so the the coil springs 64 presses the work piece W onto the lower face of the backing pad 36 with the prescribed elastic forces. The fluid, e.g., air, in the second chambers 31 is sucked, so that the work piece W is drawn toward and held by the lower face of the backing pad 36. Then, the top ring 16 is moved upward, moved toward the position above the polishing plate 12, and moved downward. With this action, the work piece W is pressed onto the polishing cloth 13. By rotating the polishing plate 12 and the top ring 16, the lower face of the work piece W can be polished.

After completing the polish, the work piece W is conveyed into the transfer unit 18 (see FIG. 4), then conveyed to an external place by the robot hand H.

In the first embodiment, the work piece W, which has been centered the pins 45, is transferred onto the mounting table 53 in that state, and sucked and held by the top ring 16, which is moved downward, at that position. Therefore, the work piece W can be held by the top ring 16 without displacement of the work piece W.

Note that, the top ring 16 is moved downward so as to hold the work piece W on the lower face of the top ring 16, but the transfer unit 18 may be moved upward so as to transfer the work piece W to the top ring 16. In this case, the transfer actions performed by the pusher stage, which is used in the conventional polishing apparatus, is not performed, so that displacement of the work piece W can be prevented.

Figure 8:
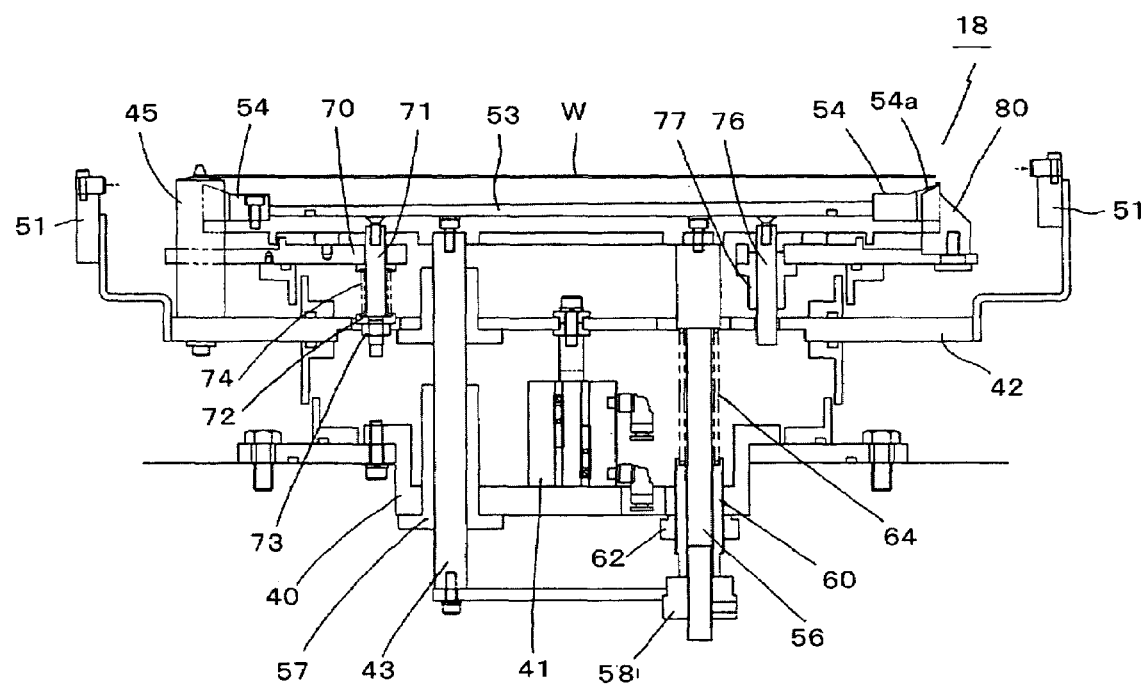
FIG. 8 is a sectional view of the transfer unit of a second embodiment.
Figure 9:
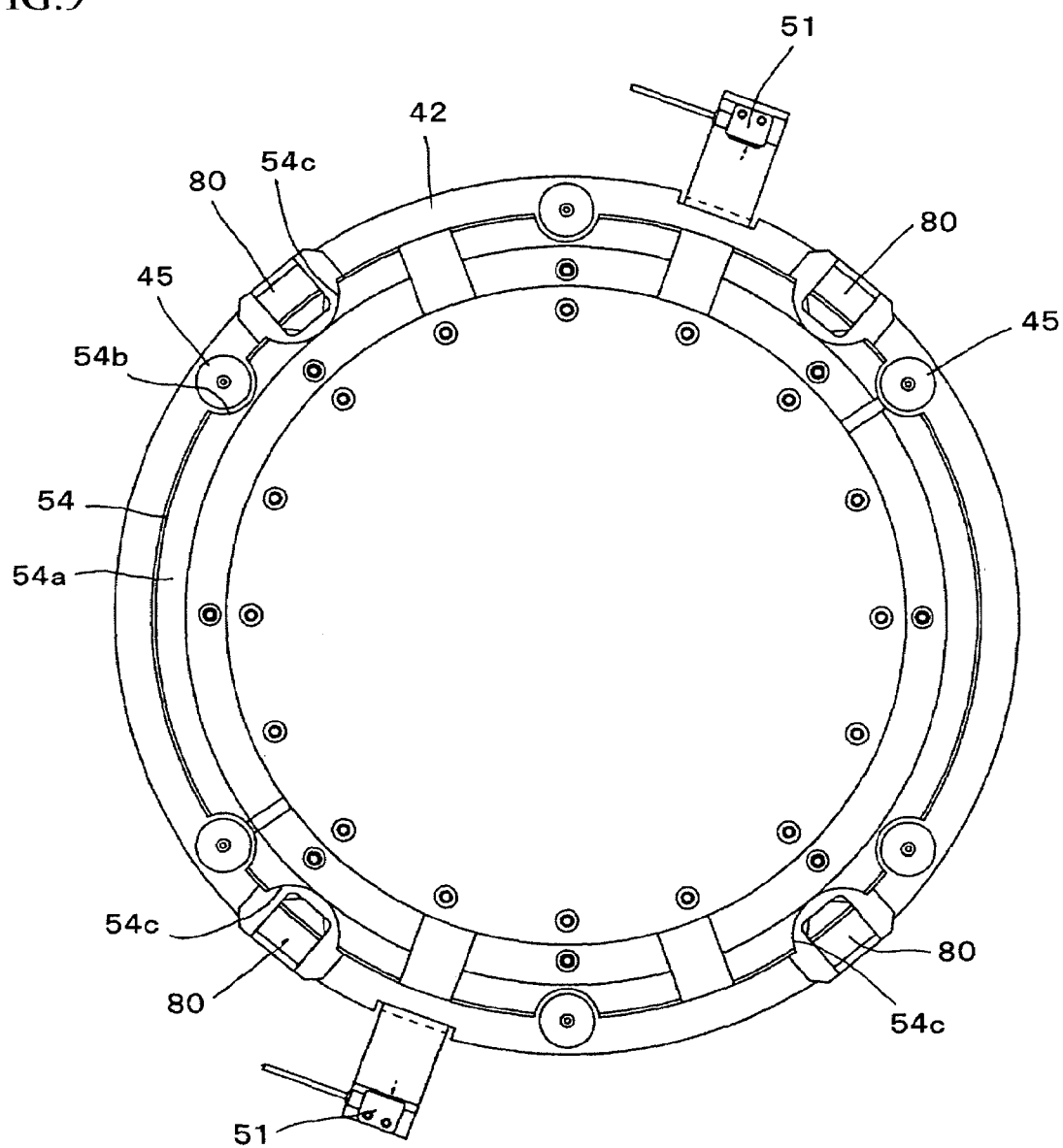
FIG. 9 is a plan view showing an arrangement of positioning pieces of the transfer unit of the second embodiment.
Figure 10:
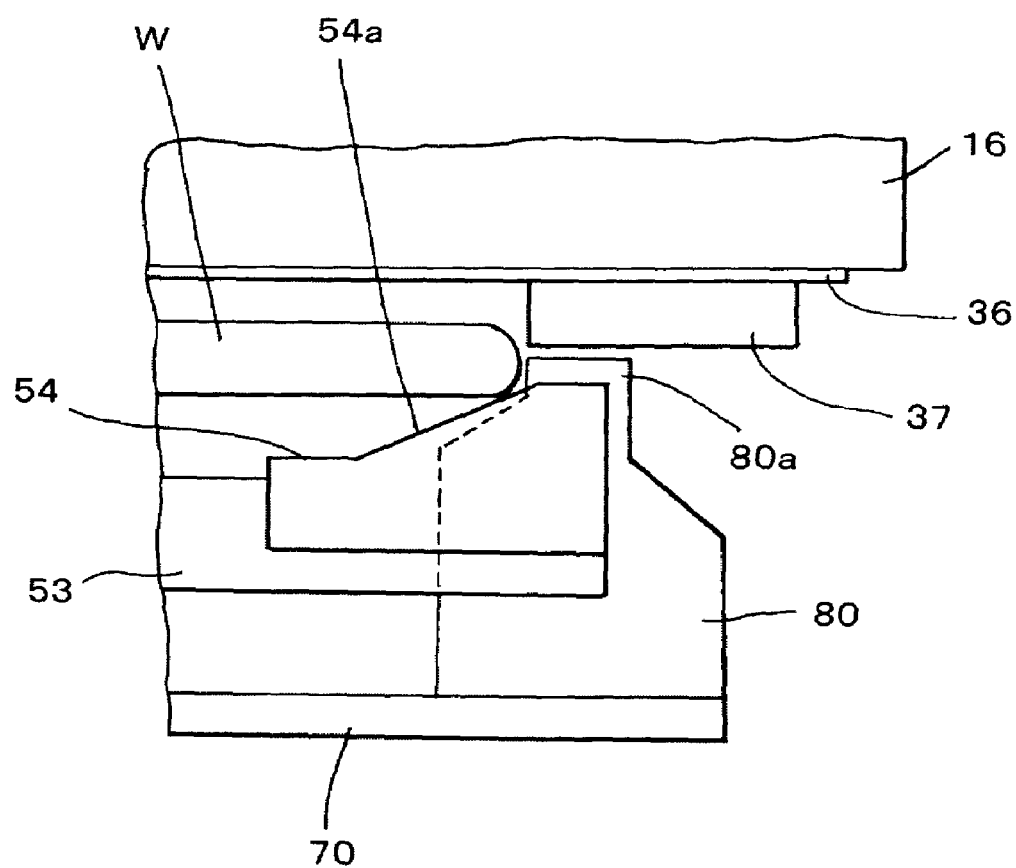
FIG. 10 is an explanation view showing the positioning piece, a template and the work piece.

A second embodiment of the transfer unit 18 is shown in FIGS. 8–10. Note that, the structural elements explained in the first embodiment are assigned the same symbols, and explanation will be omitted.

A supporting table (a supporting member) 70 is provided under the mounting table 53 and allowed to move downward.

Namely, a plurality of supporting shafts 71 are fixed to the lower face of the mounting table 53 and extended downward. The supporting shafts 71 pierce through the supporting table 70 and extended downward therefrom. Washers 72 are respectively fixed lower parts of the supporting shafts 71 by nuts 73. Coil springs (elastic members) 74 respectively covers the supporting shafts 71. The coil springs 74 are elastically provided between the lower face of the supporting table 70 and the washers 72.

With this structure, the supporting table 70 can be moved downward together with the mounting table 53 and can be separately moved downward with respect to the mounting table 53.

Note that, guide rods 76 are provided to the lower face of the mounting table 53. Guide bushings 77 are provided to the supporting table 70.

The supporting table 70 is formed into a circular shape or a radial shape. A plurality of positioning pieces 80, which are extended upward, are provided to an outer edge or edges of the supporting table 70.

As shown in FIG. 9, the four positioning pieces 80 are circularly arranged at regular angular intervals. The positions of the positioning pieces 80 are different from those of the pins 45. The positioning pieces 80 are respectively extended upward from notches 54c of the ring-shaped mounting section 54. As shown in FIGS. 4 and 10, projected sections 80a, which enclose the outer circumferential face of the work piece W so as to correctly position the work piece W without displacement when the work piece W is mounted on the mounting face 54a of the mounting section 54, are respectively provided to upper parts of the positioning pieces 80.

When the projected sections 80a of the positioning pieces 80 contact the outer circumferential face of the work piece W, even if the pins 45 are moved downward, the work piece W is not displaced. When the top ring 16 is moved downward, the template 37 firstly contacts and presses the projected sections 80a, so the positioning pieces 80 are moved downward together with the supporting plate 70. Then, the top ring 16 is further moved downward, the backing pad 36 contacts the upper face of the work piece W, and the mounting table 53 is moved downward as well. Therefore, the work piece W is pressed onto the lower face of the backing pad 36 with the prescribed force, and the top ring 16 sucks and holds the work piece W. Note that, even if the projected sections 80a are moved downward, the template 37 holds the outer edge of the work piece W instead of the projected sections 80a, so that displacement of the work piece W can be prevented.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A polishing apparatus, comprising:
    a polishing plate having an upper face covered with a polishing cloth;
    a top ring having a lower face for holding a work piece and pressing a lower face of the work piece onto the polishing cloth, said top ring being relatively moved with respect to said polishing plate so as to polish the lower face of the work piece; and
    a transfer unit located at a work piece transfer position, at which the work piece is transferred to said top ring,
    wherein said transfer unit comprises:
        a guide member having a receiving section, which guides an outer edge of the transferred work piece so as to perform centering of the work piece;
        a mounting table relatively vertically moving with respect to the guide member, the mounting table having a mounting section, which receives the centered work piece from the guide member with an upper face projecting upward;
    a coil spring elastically provided between the mounting table and a base located under the mounting table, the coil spring supporting the mounting table and allowing the mounting table to move downward;
    a shaft downwardly extended from the mounting table and having a screw section, which is pierced through and downwardly projected from the base;
    a nut screwed with the screw section of the shaft; and
    a screw cylinder, through which the shaft is pierced, screwed with a part of the base, through which the shaft is pierced,
    wherein a height of the mounting table with respect to the base and an elastic force of the coil spring can be adjusted by adjusting a screwing position of the screw cylinder with respect to the base and a position of the nut, and
    wherein the mounting table is relatively moved close to said top ring and presses the work piece onto the lower face of the top ring so as to transfer the work piece to said top ring.

2. The polishing apparatus according to claim 1,
    wherein said top ring is moved downward and moves the work piece, which has been centered on the mounting table, together with the mounting table so as to transfer the work piece to said top ring.

3. The polishing apparatus according to claim 1,
    wherein the guide member is a plurality of pins, each of which has a tapered upper end acting as a guide section for centering the work piece.

4. The polishing apparatus according to claim 1,
    wherein the mounting section of the mounting table is circularly projected upward from an outer circumferential edge of the mounting table.

5. The polishing apparatus according to claim 1,
    wherein a mounting face of the mounting section is a female tapered face, whose internal diameter is gradually made smaller toward a lower end.

6. The polishing apparatus according to claim 1,
wherein the mounting table is vertically moved along a guide rod while maintaining a horizontal situation with respect to the base.

7. The polishing apparatus according to claim 1,
wherein an elevating member, which is vertically moved by a driving unit, is provided to the base, and
the guide member is provided in the elevating member.

8. The polishing apparatus according to claim 7,
wherein the guide rod guides not only the mounting table but also the elevating member.

9. The polishing apparatus according to claim 1,
wherein said transfer unit further comprises:
   a supporting member supporting the mounting table, the supporting member having an elastic member, which allows the mounting table to move downward; and
   a plurality of positioning pieces being provided to the supporting member so as to contact an outer edge of the work piece, which has been centered on the mounting table, and position the work piece.

10. The polishing apparatus according to claim 1,
wherein the shaft is pierced through the coil spring.

11. The polishing apparatus according to claim 1, further comprising:
   a driving unit configured to vertically drive an elevating member provided to the base,
   wherein the guide member is provided in the elevating member and includes a plurality of pins, each having a tapered upper end acting as a guide section for centering the work piece.

12. The polishing apparatus according to claim 11,
wherein the driving unit moves the elevating member upward such the tapered upper ends of the pins are located at positions fully above an upper face of the mounting section of the mounting table.

13. The polishing apparatus according to claim 12,
wherein when the tapered upper ends of the pins are located at the positions fully above the upper face of the mounting section, the work piece is conveyed and correctly positioned into a space between the tapered upper ends of the pins.

14. The polishing apparatus according to claim 13,
wherein when the work piece is conveyed and correctly positioned into the space between the tapered upper ends of the pins, the driving unit moves the elevating member downward together with the pins such that the work piece is transferred onto a mounting face of the mounting section such that an upper face of the work piece is higher than an upper end of the mounting face of the mounting table.

15. The polishing apparatus according to claim 14,
wherein when the work piece is transferred onto the mounting face of the mounting section such that the upper face of the work piece is higher than the upper end of the mounting face of the mounting table, the top ring is moved downward against an elastic force of the coil spring such that the coil spring is compressed and presses the work piece onto the lower face of the top ring.

16. The polishing apparatus according to claim 15,
wherein the work piece is held against the lower face of the top ring via suction and transferred to the polishing plate, pressed against the polishing plate, and
wherein the polishing plate and the top ting are rotated with respect to each other to polish the work piece.

* * * * *